(12) United States Patent
Wyrzykowska et al.

(10) Patent No.: US 7,220,287 B1
(45) Date of Patent: May 22, 2007

(54) METHOD FOR TUNING AN EMBEDDED CAPACITOR IN A MULTILAYER CIRCUIT BOARD

(75) Inventors: Aneta Wyrzykowska, Dunrobin (CA); Herman Kwong, Kanata (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/653,289

(22) Filed: Sep. 3, 2003

(51) Int. Cl.
*H01G 9/00* (2006.01)
*H01L 27/108* (2006.01)

(52) U.S. Cl. ............... 29/25.03; 29/25.41; 29/25.42; 29/852; 29/846; 29/847; 257/303

(58) Field of Classification Search ............ 29/25.41, 29/25.42, 852, 846, 847, 593, 25.03; 257/296, 257/300, 301, 303; 216/13, 17, 75; 361/714, 361/821, 763, 792; 174/96, 167, 262, 261
See application file for complete search history.

(56) References Cited

U.S. PATENT DOCUMENTS

| | | | | |
|---|---|---|---|---|
| 4,409,608 | A | * | 10/1983 | Yoder .................. 257/534 |
| 4,650,544 | A | * | 3/1987 | Erb et al. .................. 438/387 |
| 5,027,253 | A | * | 6/1991 | Lauffer et al. ............ 361/321.4 |
| 5,973,929 | A | * | 10/1999 | Arakawa et al. ............ 361/762 |
| 6,057,571 | A | * | 5/2000 | Miller et al. ................. 257/296 |
| 6,351,880 | B1 | * | 3/2002 | Palmer et al. .............. 29/25.42 |
| 6,388,207 | B1 | * | 5/2002 | Figueroa et al. ............. 174/262 |
| 6,399,975 | B1 | * | 6/2002 | Cheong et al. .............. 257/296 |
| 6,621,012 | B2 | * | 9/2003 | Crockett et al. ............ 174/261 |

OTHER PUBLICATIONS

Howard Johnson and Martin Graham, "High-Speed Digital Design: A Handbook of Black Magic," pp. 257-258.

* cited by examiner

*Primary Examiner*—A. Dexter Tugbang
*Assistant Examiner*—Tai Van Nguyen
(74) *Attorney, Agent, or Firm*—Hunton & Williams LLP

(57) ABSTRACT

Exemplary techniques for tuning the effective capacitance provided by an embedded capacitor are disclosed. The techniques may be realized by modifying one or more conductive features of one or more vias connected to the embedded capacitor to adjust the capacitance contributed by the one or more vias. One technique preferably includes altering the conductive surface area of a pad of one or more vias to which the embedded capacitor is electrically connected to increase or decrease the contributed capacitance. Another technique provides for bore drilling or tap drilling one or more vias connected to the embedded capacitor to increase the surface area of plated interior surfaces of the vias, thereby increasing their capacitive effect. An additional technique includes forming a number of vias having various capacitive effects and electrically connecting the embedded capacitor to one or more of these vias to increase the capacitance.

15 Claims, 9 Drawing Sheets

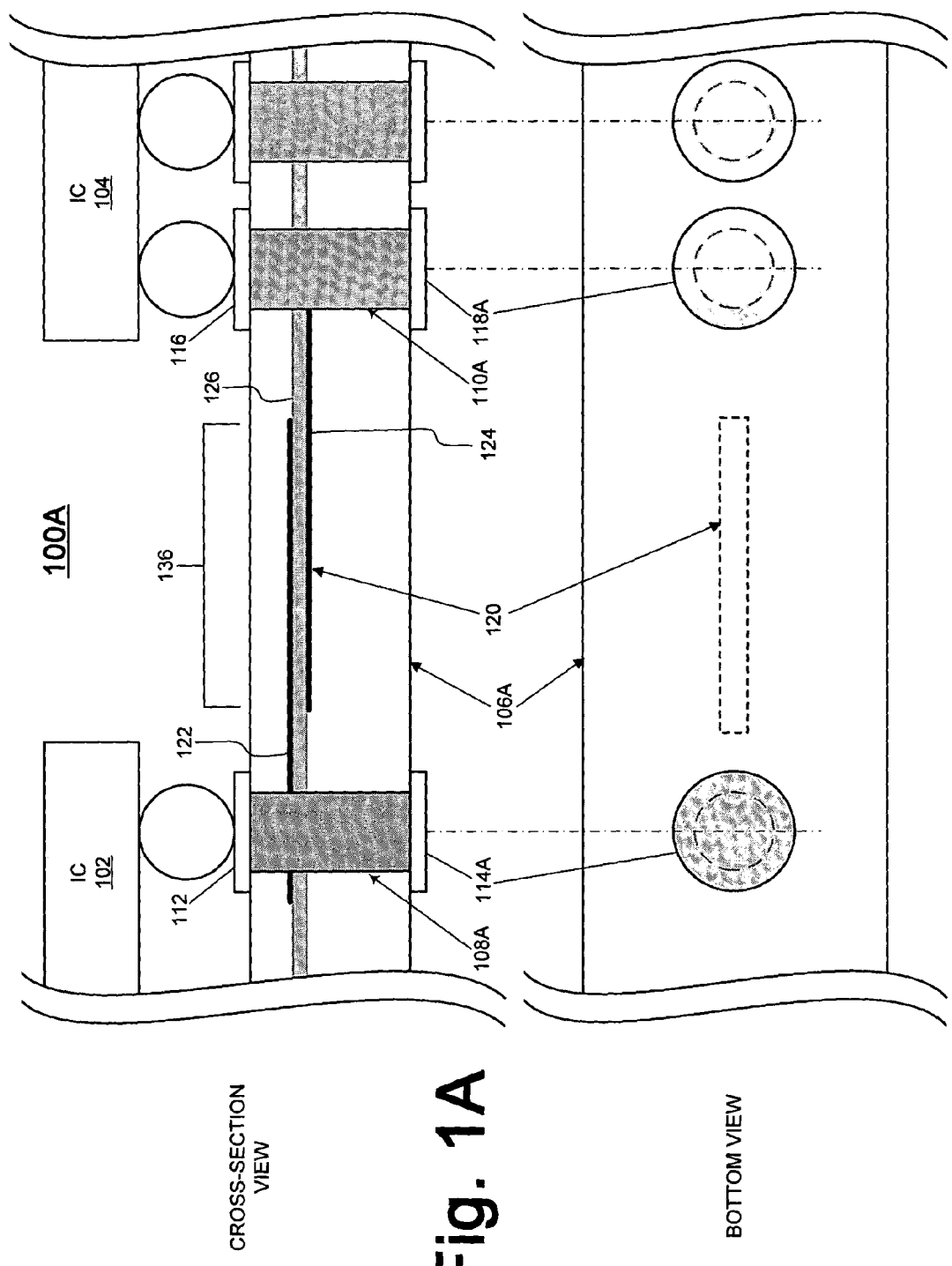

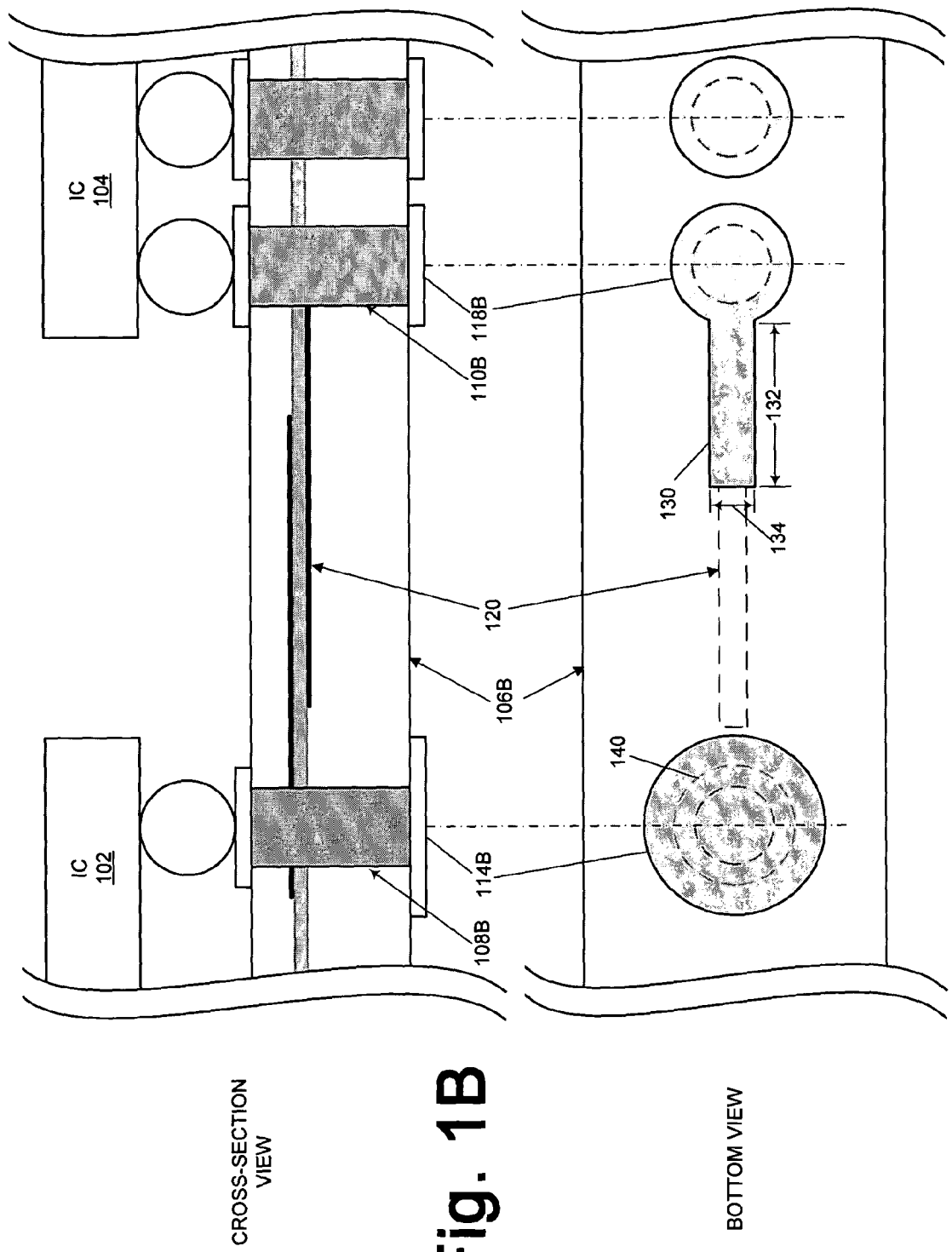

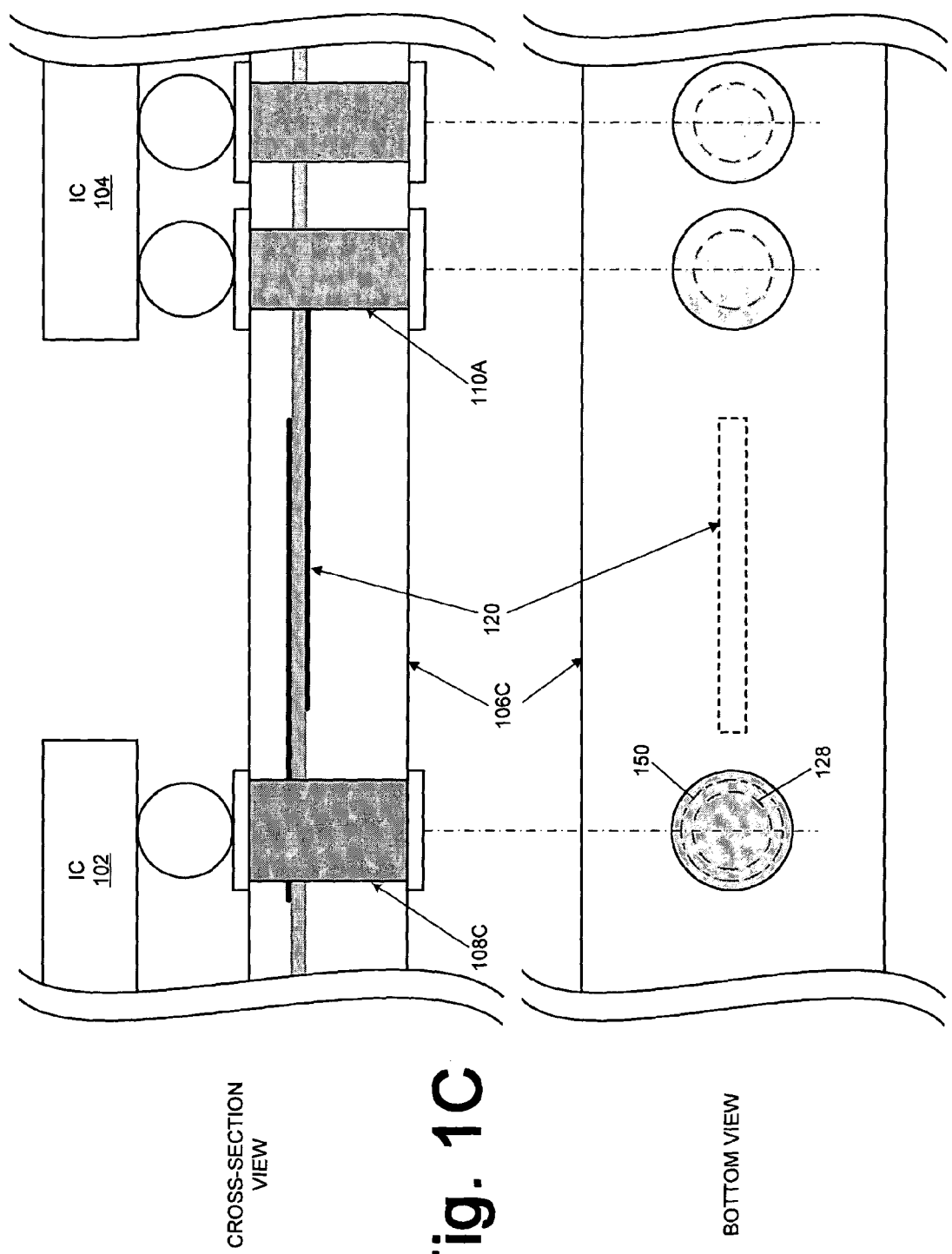

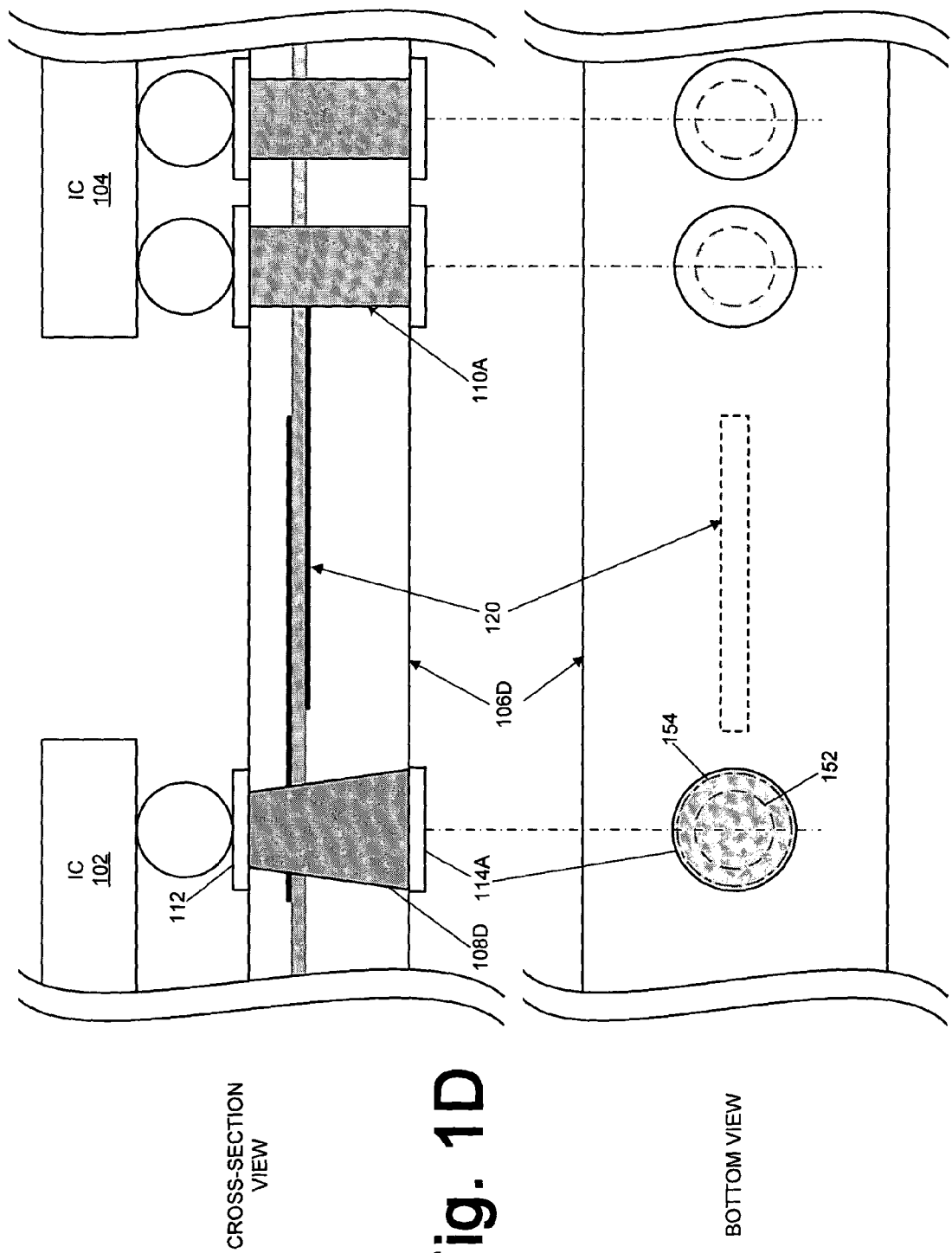

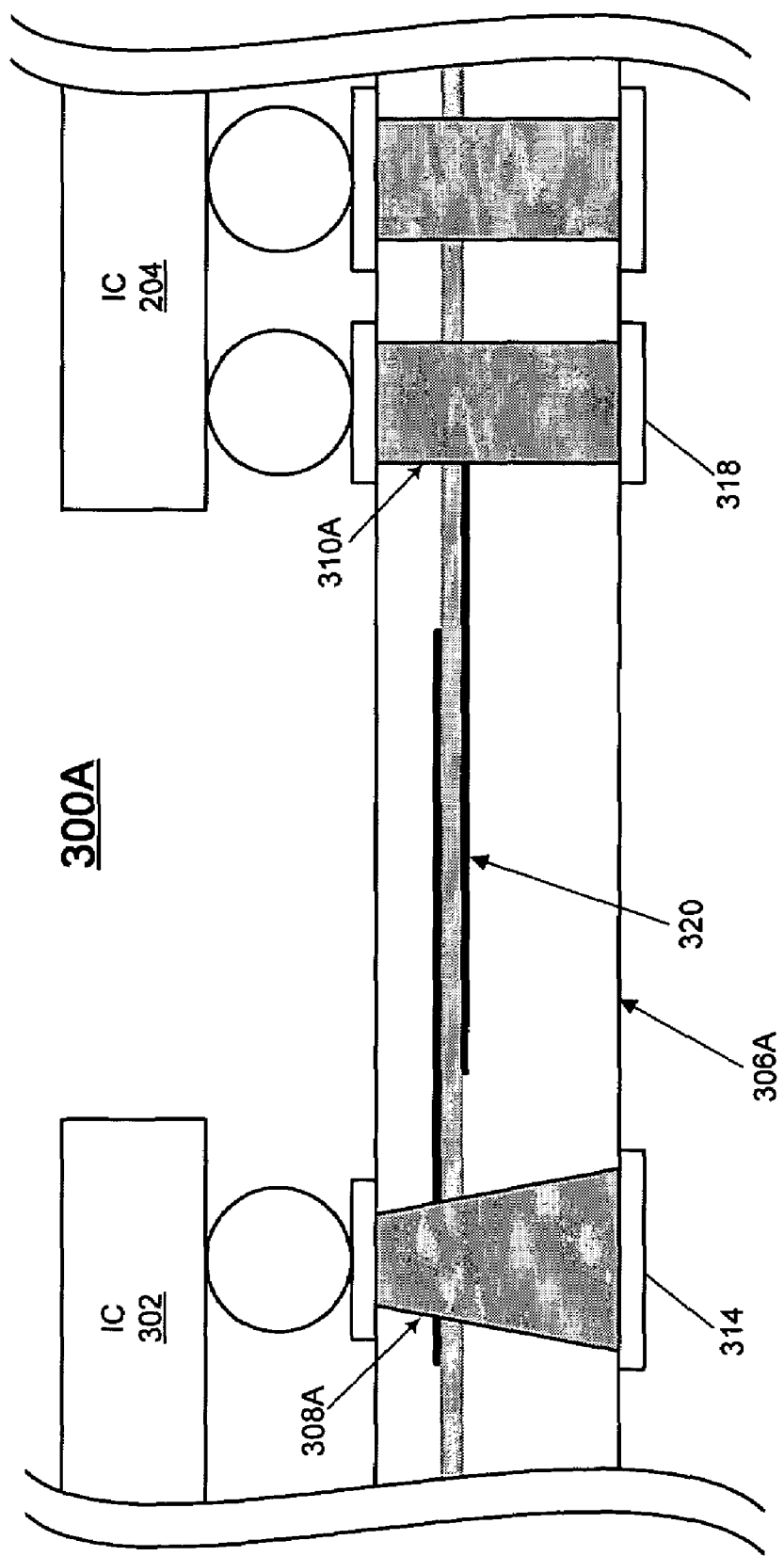

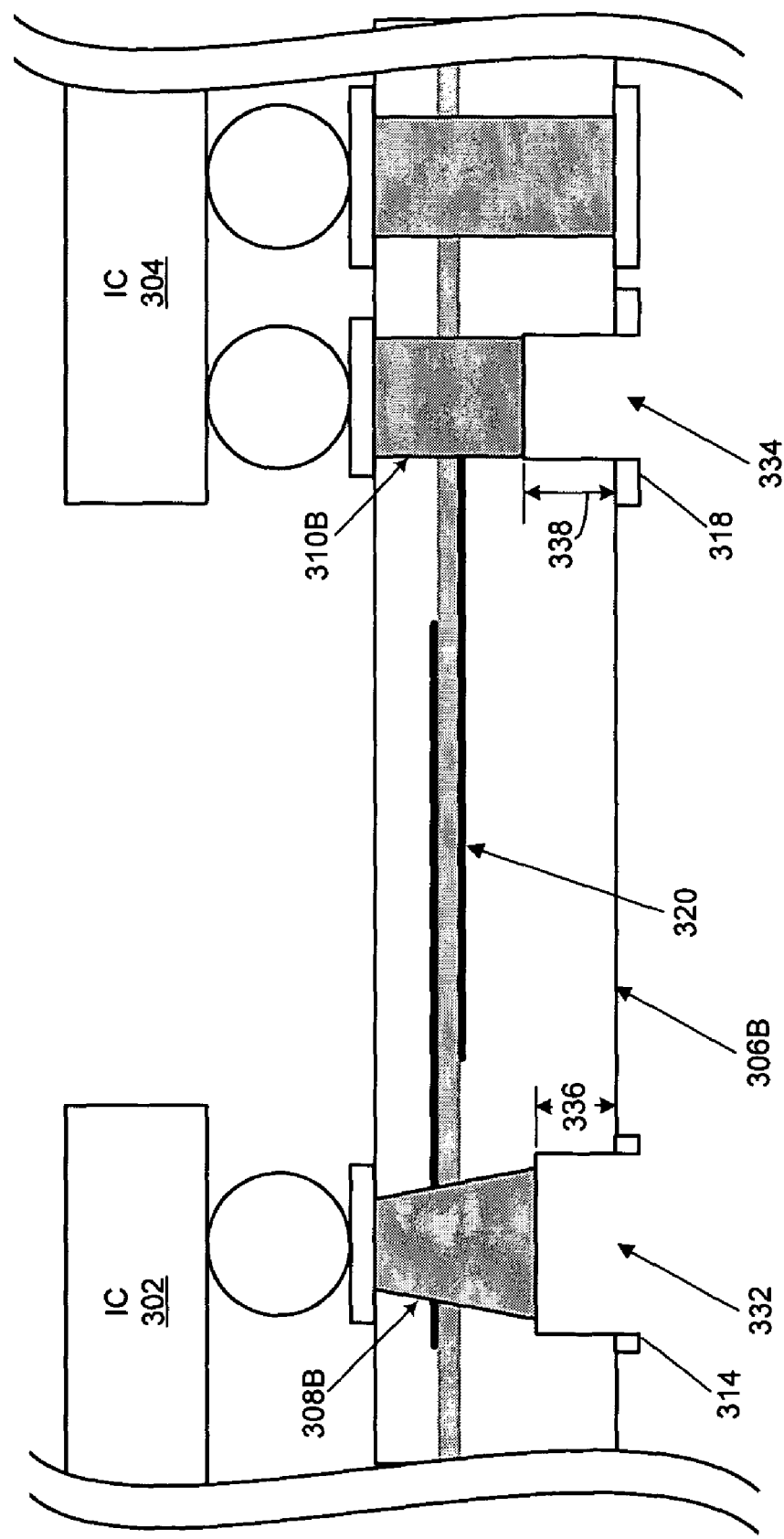

METHOD FOR TUNING AN EMBEDDED CAPACITOR IN A MULTILAYER CIRCUIT BOARD

FIELD OF THE INVENTION

The present invention relates generally to embedded capacitors in multilayer circuit boards and, more particularly, to techniques for tuning the capacitance of an embedded capacitor by modifying one or more features of one or more vias connected thereto.

BACKGROUND OF THE INVENTION

Capacitors formed within, or "embedded" in, multilayer circuit boards often are beneficially used in addition to or in place of discrete surface mount (SMT) capacitors. Discrete capacitors frequently introduce undesirable inductance from the vias and solder joints used to connect the discrete capacitors to the circuit. Discrete capacitors also consume the circuit board's surface area, preventing the connection of other surface devices. In contrast, embedded capacitors frequently exhibit less inductance than surface capacitors because of their proximity to the driver and receiver and due to their lack of solder joints and extra vias. Further, because they are embedded in inner layers of the circuit board, surface area is freed for use by other surface mount devices.

For all of their benefits over discrete capacitors, the capacitive values of embedded capacitors often are not as consistent as those of discrete capacitors. While discrete capacitors may be manufactured to have a predictable capacitance with slight variation, embedded capacitors often have unpredictable capacitances resulting from the circuit board manufacturing processes. This problem is compounded once the embedded capacitor is laminated inside the substrate of the circuit board because conventional capacitance tuning techniques typically cannot be employed. As a result, when a circuit board having an embedded capacitor with inadequate capacitance is detected, conventional techniques typically call for adjusting the nominal capacitance by adding a surface mount capacitor in parallel, thereby introducing the undesirable effects of discrete capacitors. Conventional techniques, however, do not provide for an efficient way to decrease the capacitance of an embedded capacitor having excessive capacitance in a laminated circuit board. For such modification to take place using conventional techniques, the discrete capacitor typically would be placed in series with the embedded and, as such, would necessitate the inclusion of connecting pads on the board that are shorted together. The short is usually provided using a discrete zero ohm or low ohm resistor which would introduce the undesirable effects of discrete components noted above. Consequently, the circuit board typically is either used in its present condition, often to ill effect, or it is discarded.

In view of the foregoing, it would be desirable to provide techniques for tuning embedded capacitors that overcome the above-described inadequacies and shortcomings in an efficient and cost effective manner.

SUMMARY OF THE INVENTION

According to the present invention, techniques for tuning embedded capacitors in a multilayer circuit board are provided. In one particular exemplary embodiment, the techniques may be realized as method for tuning an embedded capacitor in a circuit board. The embedded capacitor is connected to a via of the circuit board and the method comprises the step of modifying at least one conductive feature of the via to change a capacitance contributed by the via. The at least one conductive feature may include a conductive surface area of a surface pad of the via. In this instance, the step of modifying the at least one conductive feature may include reducing the conductive surface area of the surface pad to reduce the capacitance contributed by the via or increasing the conductive surface area of the surface pad to increase the capacitance contributed by the via. Increasing the conductive surface area of the surface pad may include increasing a diameter of the surface pad or forming a conductive plane on the circuit board, the conductive plane being proximal to and electrically connected to the surface pad.

Alternatively, the at least one conductive feature may include a conductive plating on an interior surface of the via. In this instance, the step of modifying the at least one conductive feature includes counter drilling the via to remove at least part of the conductive plating from the interior surface of the via to reduce the capacitance contributed by the via. The step of modifying the at least one conductive feature also may include tap drilling the circuit board so that the via has a substantially conical shape before the interior surface of the via is plated with conductive material. In yet another instance, the at least one conductive feature includes a conductive trace connecting the embedded capacitor to the via.

In another particular exemplary embodiment, the techniques may be realized as a method for altering an effective capacitance of an embedded capacitor in a circuit board is provided, the embedded capacitor being connected to a via of the circuit board. The method comprises the steps of forming one or more auxiliary vias in the circuit board and electrically connecting the via to at least one of the one or more auxiliary vias to alter the effective capacitance. The step of electrically connecting the via to at least one of the one or more auxiliary vias may include forming at least one conductive trace between a surface pad of the via and a respective surface pad of each of the at least one auxiliary vias. The method further may comprise the step of counter drilling one or more of the auxiliary vias to remove at least part of the conductive plating from the interior surfaces of the one or more auxiliary vias to reduce the capacitance contributed by the one or more auxiliary vias.

In yet another particular exemplary embodiment, the techniques may be realized as a method for altering an effective capacitance of an embedded capacitor in a circuit board is provided, the embedded capacitor being connected to a via of the circuit board. The method comprises the step of increasing a conductive surface area of a surface pad of the via to increase the capacitance contributed by the via. Increasing the conductive surface area of the surface pad may include increasing a diameter of the surface pad or forming a conductive plane on the circuit board, the conductive plane being proximal to and electrically connected to the surface pad.

In an additional particular exemplary embodiment, the techniques may be realized as a method for altering an effective capacitance of an embedded capacitor in a circuit board is provided, the embedded capacitor being connected to a via of the circuit board. The method comprises the step of counter drilling the via to remove at least part of a conductive plating from an interior surface of the via to reduce the capacitance contributed by the via. The interior surface of the via preferably has a substantially conical shape.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

FIG. 1A is a cross-section view and bottom view illustrating an exemplary printed circuit board (PCB) including an embedded capacitor having insufficient capacitance in accordance with at least one embodiment of the present invention.

FIG. 1B is a cross-section view and bottom view of the PCB of FIG. 1A illustrating an exemplary technique for increasing the effective capacitance of the embedded capacitor by increasing a conductive surface area of one or more surface pads in accordance with at least one embodiment of the present invention.

FIGS. 1C and 1D are cross-section and bottom views of the PCB of FIG. 1A illustrating exemplary techniques for increasing the effective capacitance of the embedded capacitor by increasing a plated interior surface of a via in accordance with at least one embodiment of the present invention.

FIGS. 3A and 3B are cross-section views of a printed circuit board having an embedded capacitor and illustrating an exemplary technique for reducing an effective capacitance by removing at least part of a plated interior surface of a via by counter drilling in accordance with at least one embodiment of the present invention.

DETAILED DESCRIPTION OF EXEMPLARY EMBODIMENT(S)

Figure 2A:
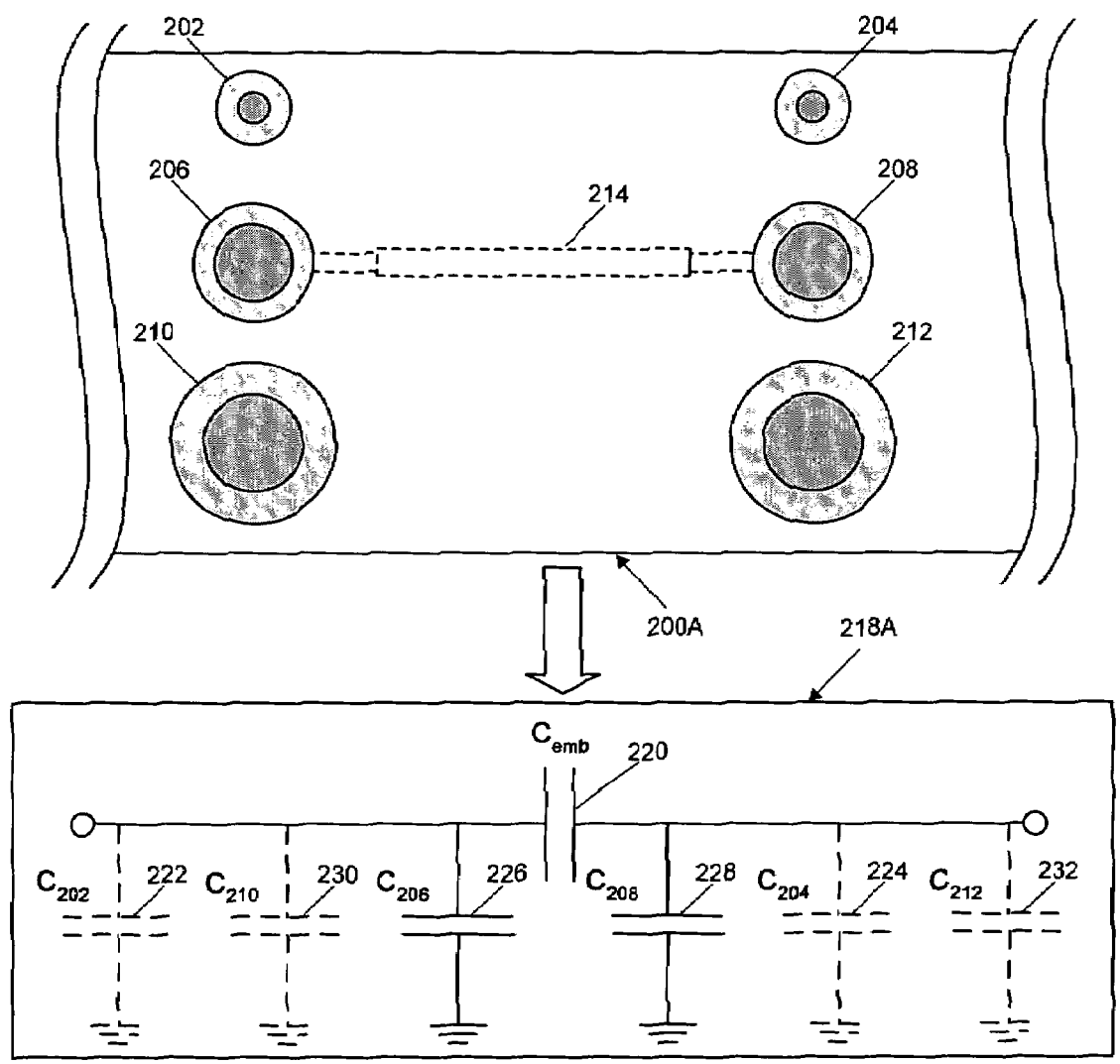
FIGS. 2A–2C are plan views illustrating an exemplary printed circuit board having auxiliary vias to increase an effective capacitance in accordance with at least one embodiment of the present invention.

The following description is intended to convey a thorough understanding of the present invention by providing a number of specific embodiments and details involving tuning embedded capacitors in printed circuit boards and other circuit devices. It is understood, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

FIGS. 1A–3B illustrate various exemplary techniques for tuning an embedded capacitor formed in a multilayer circuit board. In at least one embodiment, one or more conductive features of one or more vias connected to the embedded capacitor may be modified to adjust the capacitance contributed by the one or more vias. One technique preferably includes increasing or decreasing the conductive surface area of a pad of one or more vias to which the embedded capacitor is electrically connected to increase or decrease, respectively, the contributed capacitance. Another technique provides for bore drilling or tap drilling one or more vias connected to the embedded capacitor to increase the surface area of plated interior surfaces of the vias, thereby increasing their capacitive effect. Another technique includes forming a number of vias having various capacitive effects and electrically connecting the embedded capacitor to one or more of these vias to increase the capacitance.

For embedded capacitors having excessive capacitance, a number of techniques are provided to reduce the effective capacitance. One disclosed technique provides for the counter drilling of one or more vias to which the embedded capacitor is connected to remove at least part of the conductive plating on the interior surface and thereby reduce the capacitive effect of the counter drilled vias. The techniques for increasing the effective capacitance and techniques decreasing the effective capacitance disclosed herein may be used in combination to tune an embedded capacitor to be substantially equivalent to the ideal, or desired, capacitance.

The term via refers to any of a variety of multilayer connection features, including but not limited to through holes, microvias, blind vias, buried vias and the like. Although the exemplary techniques are discussed below in the context of through holes for ease of illustration, those skilled in the art may apply the techniques provided herein to tune embedded capacitors connected to other types of vias without departing from the spirit or the scope of the present invention.

Referring now to FIGS. 1A–D, various techniques for increasing the capacitance of an embedded capacitor by modifying one or more conductive features of a multilayer circuit board are illustrated in accordance with at least one embodiment of the present invention.

FIG. 1A illustrates a cross-section view and a bottom view of an exemplary circuit module 100A having an embedded capacitor with insufficient capacitance prior to tuning. In the illustrated example, the module 100A includes integrated circuits (ICs) 102 and 104 capacitively coupled by an embedded capacitor 120 formed in a multilayer printed circuit board (PCB) 106A. In at least one embodiment, the embedded capacitor 120 includes a planar capacitor comprising, for example, a transmission line portion 122 on one side of dielectric material (e.g., dielectric layer 126) and a transmission line portion 124 on the opposing side of the dielectric material, where the transmission line portion 122 is electrically connected to the IC 102 by a via 108A and the transmission line portion 124 is electrically connected to the IC 104 by a via 110A. The transmission line portions 122, 124 preferably are coextensive and substantially parallel over region 136 of the dielectric material. The width of the region 136 can be the same or uniform from one end to the other. It can also be increased or decreased to vary the desired capacitance in shapes of rectangle, square, circle, etc., in region 136.

Although FIG. 1A illustrates an exemplary implementation whereby a single embedded capacitor is used to capacitively couple ICs 102, 104, any number of embedded capacitors may be implemented in an attempt to achieve the desired capacitance. For example, any number of embedded capacitors may be connected in series or parallel (or both) to achieve the desired capacitance. Accordingly, any reference to a capacitor applies equally to a combination of capacitors, unless otherwise noted.

In the illustrated embodiment, the transmission line portions 122, 124 are embedded on different PCB layers with the dielectric layer 126 interposed in between. In another embodiment, the transmission line portions 122, 124 may be embedded on the same PCB layer with dielectric material interposed between the transmission line portions 122, 124, etc.

As is well known in the art, the vias 108A and 110A may be formed by drilling or otherwise creating a hole that penetrates multiple layers of the PCB 106A (preferably penetrating from the top surface to the bottom surface) and then plating the interior surface of the via with a conductive material. The vias 108A and 110A then may be filled with a dielectric material, such as epoxy, and pads 112, 114A, 116 and 118A may be formed on the top and bottom, respectively, of the vias 108A and 110A. The vias 108A and 110A preferably are connected to surface pads for IC 102 and IC 104 to attach on at a distance sufficient to avoid solder paste sinking into the vias during the assembly process which would create solder joint reliability problem. For simplicity of description, via-in-pad technology is described herein.

It will be appreciated that the configuration of such vias often introduces additional capacitance as a result of the pads or the conductive lining of the via.

Those skilled in the art will recognize that conventional techniques for forming the embedded capacitor 120 often results in the embedded capacitor 120 having a capacitance that exceeds or falls below a desired capacitance. Reasons for this variance may include: variation in conductor dimensions in the parallel plate region 136 comprising the trace portions 122, 124; variation in the thickness of the dielectric layer 126; variation in the length of the trace portions 122, 124 (thereby affecting the length of the region 136); and impurities in the dielectric layer 126. Furthermore, as discussed above, the vias 108A, 110A add to the effective capacitance between the ICs 102, 104. As with the embedded capacitor 120, the capacitances contributed by the vias 108A, 110A typically are difficult to maintain within a certain threshold and therefore frequently increases the uncertainty of the capacitance during the manufacturing processes.

Referring now to FIG. 1B, an exemplary technique for tuning a capacitor having insufficient capacitance is illustrated. In the illustrated example, the conductive surface area of pads 114A and 118A of vias 108B and 110B of the PCB 106A may be increased (resulting in pads 114B and 118B, respectively) to increase the effective capacitance between the IC 102 and the IC 104. The PCB 106B represents the PCB 106A after this modification.

As noted above, the pads of vias connected to the embedded capacitor 120 typically contribute to the effective capacitance exhibited between the IC 102 and the IC 104. Accordingly, in at least one embodiment, the conductive surface area of the pads of the vias 108A and 110A may be increased to increase the capacitance contributed by the respective via and therefore increase the effective capacitance.

In certain instances, the change in the capacitance contributed by change in pad size may be represented the following equation derived by Howard Johnson and Martin Graham at page 257 of their book entitled "High-Speed Digital Design: A Handbook of Black Magic":

$$C = \frac{1.41 \times er \times T \times D_1}{D_2 - D_1} \qquad \text{EQ. 1}$$

where C represents the capacitance, er represents a dielectric constant value, T represents the thickness of the PCB, $D_1$ represents the diameter of the via pad prior to alteration, and $D_2$ represents the diameter of the via antipad. From EQ. 1, it can be seen that the change in capacitance is proportional to the change in pad size. As such, if the pad diameter increases, so does the capacitance, and vice versa.

The pads may be modified in any of a variety of ways to increase effective capacitance. In the example of FIG. 1B, the diameter of the conductive surface area of the pad 114A (FIG. 1A) may be increased, resulting in an enlarged pad 114B. The original circumference of the pad 114A is illustrated for comparative purposes as dashed line 140. The enlarged pad 114B may formed in any of a variety of ways. For example, the additional conductive material may be deposited along the outer circumference of the original pad 114A in a manner similar to that used to form the original pad 114A. To illustrate, the enlarged pad 114B may be design to be larger than the original pad 114A at the PCB layout or design stage. Alternatively, the original pad 114A may be enlarged to pad 114B by, for example, applying conductive materials such as metallic based conductive polymer (silver- or copper-based polymers, for example) onto the conductive pad 114A after the PCB 106A is finished. Additionally, the pad 114B could be formed by silk screening, ink jetting, chemical vapor deposit or other coating techniques.

Rather than, or in addition to, increasing the diameter of a pad, the conductive surface area of the pad may be increased by connecting a conductive line or plane to the pad. As illustrated in FIG. 1B, the pad 118A (FIG. 1A) may be modified by forming a conductive plane 130 having length 132 and width 134 on the surface of the PCB 106B, where the plane 130 includes conductive material electrically connected to the pad 118B. As with the enlarged pad 114A, the plane 130 may be formed using any of a variety of techniques known in the art.

Referring now to FIGS. 1C–1D, additional exemplary techniques for increasing the effective capacitance by modifying a diameter of one or more vias are illustrated. Vias generally are formed by drilling a hole of diameter $d_1$ and depth T in a PCB (where T generally is the thickness of the PCB). The interior surface area is plated with a conductive material and often then is filled with a dielectric material such as epoxy. This conductive plating on the interior surface contributes to the capacitance introduced by the via, where the amount of capacitance contributed is roughly proportional to the plated area of the interior surface of the via (as per EQ. 1).

As the amount of capacitance contributed by the via coating often is dependent at least in part on the plated interior surface area of the via, in at least one embodiment the plated surface area of the via may be increased to increase the capacitance contributed by the via and therefore increase the effective capacitance. The increase in the plated surface area may be achieved in any of a variety of ways. During the manufacturing process, the via could be drilled to have a diameter $d_2$ that is greater than the diameter $d_1$ conventionally used under the circumstances so that the enlarged via contributes a greater amount of capacitance.

To illustrate by way of FIG. 1C, the dashed line 128 may represent the circumference of a via 108A (FIG. 1A) having a diameter $d_1$ that conventionally would be used and the dashed line 150 may represent the circumference of an enlarged via 108C of the PCB 106C having an enlarged diameter $d_2$.

By forming an enlarged via during the manufacturing process, additional capacitance may be added to the effective capacitance. To illustrate, assuming that the capacitance contributed by a via is roughly proportional to the plated interior surface area of the via, the increase in the contributed capacitance may be described by EQ. 1 above.

In certain instances, however, it may prove impracticable to enlarge the interior surface area of the via by forming a larger cylindrical hole. The space in the PCB available for enlargement of vias may be limited by, for example, pad size, surface component density, the proximity of other vias, line traces within the PCB, and the like. As illustrated in the exemplary embodiment of FIG. 1D, these limitations often may be overcome by forming a via 108D having a substantially conical hole in the PCB 106D when feature density on the opposite side of the component placement side allows. In the illustrated example, the smaller circumference (represented by dashed line 152) of the via 108D has a diameter $d_3$ at the pad 112 and the larger circumference (represented by dashed line 154) has a diameter $d_4$ at the pad 114A. The conical via 108D may be formed at the time of manufacture of the PCB 106D using, for example, a tap drill to form the conical hole shape.

It will be appreciated that the conical shape of the via 108D provides an enlarged surface area compared to a cylindrical via having a diameter $d_2$ but a decreased surface area available for plating compared to a cylindrical via having a diameter $d_4$. The conical shape of the via 108D, however, allows for via arrangements that would not be possible with cylindrical vias of diameter $d_4$. To illustrate, because the exemplary cylindrical via 108D narrows as it approaches the pad 112, smaller pads may be used and/or more PCB space may be available near the pad 112 than may be possible with a cylindrical via of diameter $d_4$.

In the event that the enlarged via 108C or the conical via 108D results in an effective capacitance that is greater than ideal or desired, the effective capacitance may be reduced by using one or more capacitance trimming techniques described in detail below.

Figure 2B:
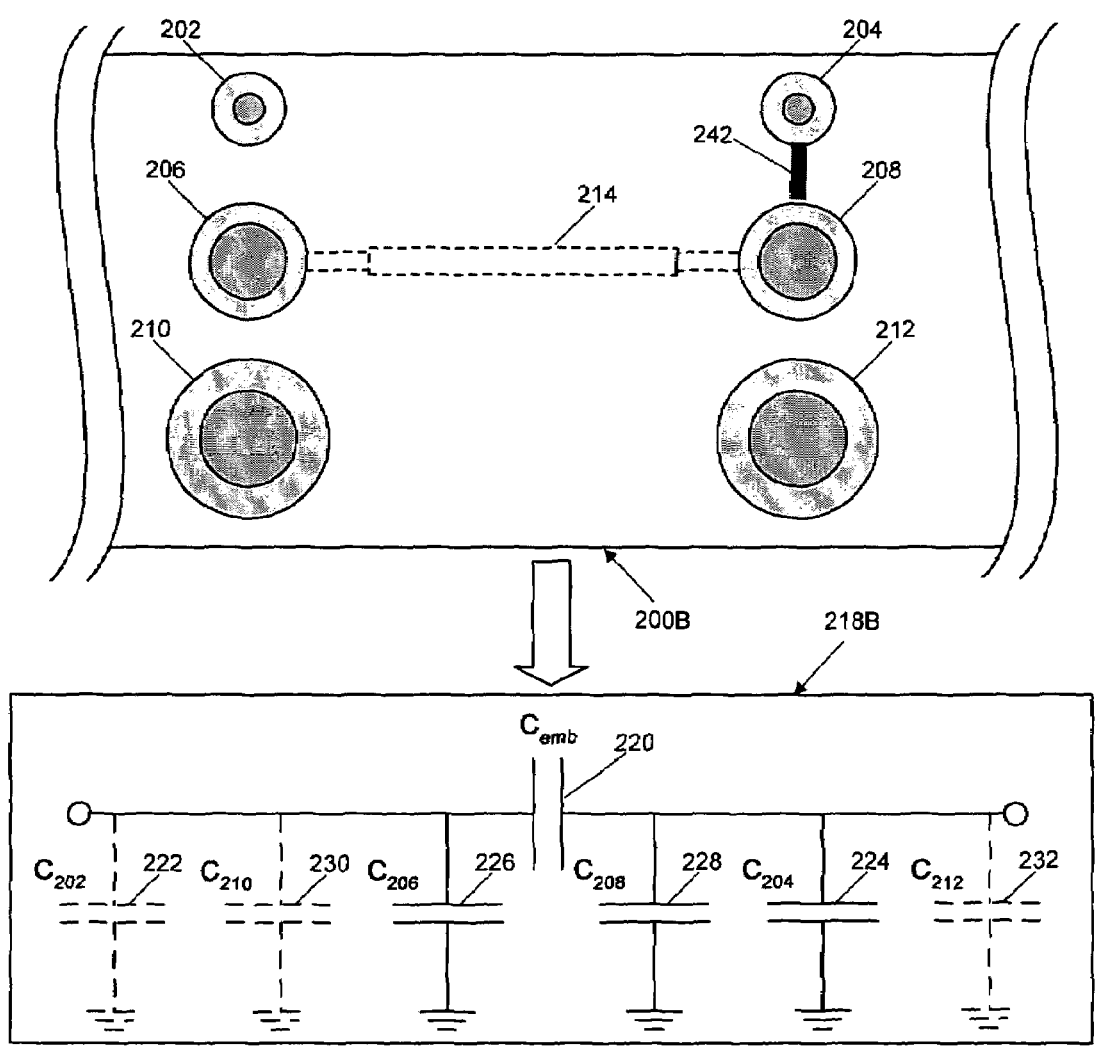
Figure 2C:
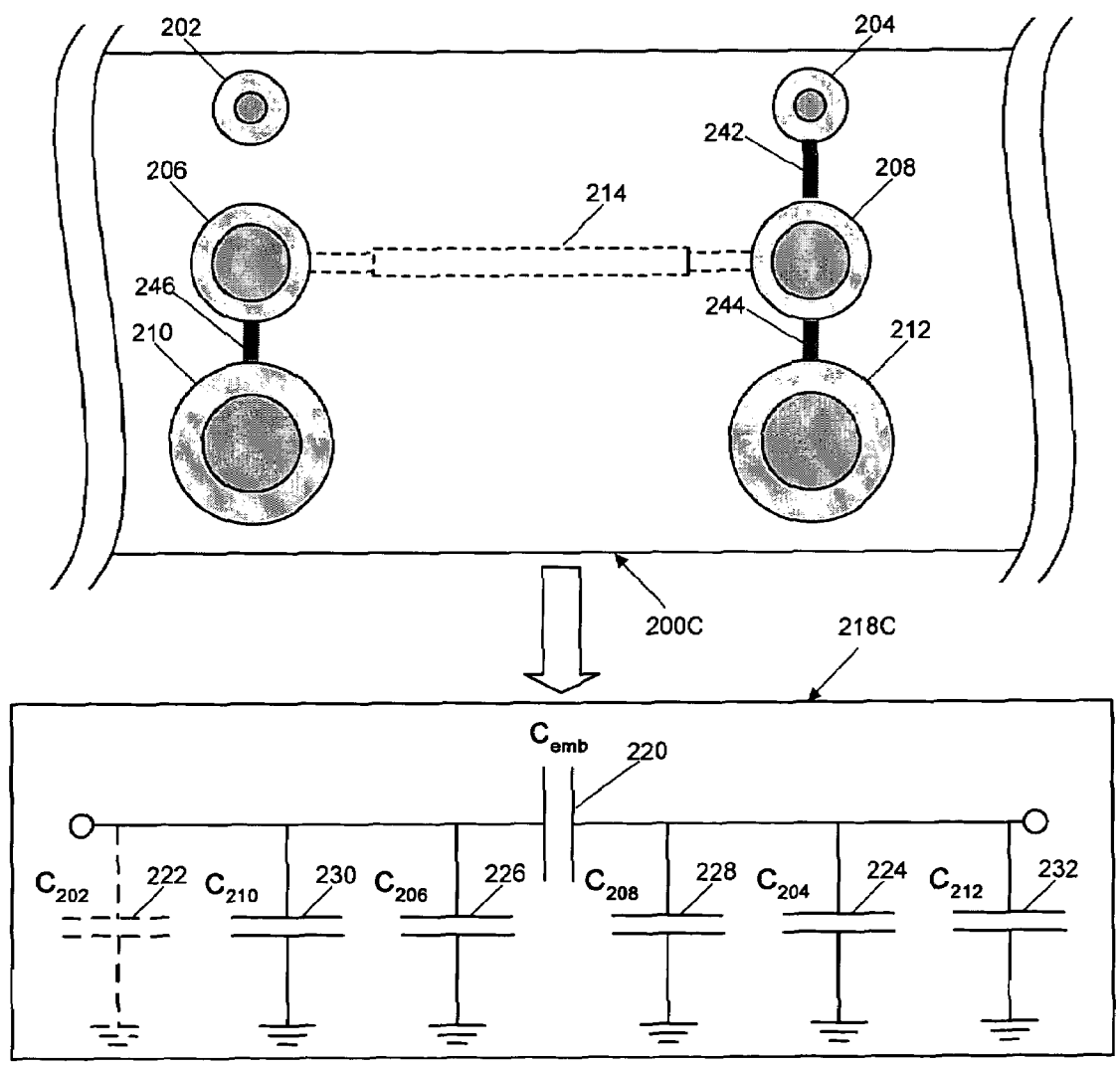

Referring now to FIGS. 2A–2C, an exemplary technique for altering the effective capacitance of an embedded capacitor by using a combination of vias is illustrated in accordance with at least one embodiment of the present invention. FIG. 2A illustrates an exemplary PCB 200A having an embedded capacitor 214 formed in a manner similar to the technique described above. In the illustrated example, the embedded capacitor 214 is electrically connected at one "terminal" to via 206 and to via 208 at the other "terminal."

In certain instances, the capacitance provided by the embedded capacitor 214, together with the capacitance contributed by the vias 206 and 208, may be insufficient for the desired purpose. Accordingly, in at least one embodiment, one or more auxiliary vias may be formed in the PCB 200A to which either of the vias 206, 208 may be connected to increase the effective capacitance. In the illustrated example, through holes 202, 204, 210 and 212 are formed in the PCB 200A as auxiliary vias for use in increasing capacitance.

The circuit diagram 218A illustrates a simplified representation of the circuit formed by the vias 202–212 and the embedded capacitor 214. Capacitors 222–232 represent the capacitance contributed by the vias 202–212, respectively (denoted $C_{202}$, $C_{204}$, $C_{206}$, $C_{208}$, $C_{210}$ and $C_{212}$, respectively). Capacitor 220 represents the capacitance $C_{emb}$ contributed by the embedded capacitor 214.

Prior to the connection of either of the vias 206, 208 to any of the auxiliary vias 202, 204, 210, 212, the effective capacitance may be represented as the combination of capacitors 220, 226 and 228. As none of the auxiliary vias 202, 204, 210 and 212 are connected to the vias 206, 208 in the illustrated example of FIG. 2A, their respective capacitors 222, 224, 230 and 232 are illustrated using dashed lines in the circuit diagram 218A to indicate that they are not connected.

The number, size and placement of the auxiliary vias preferably are arranged so as to provide a substantial range of possible effective capacitance values when one or a combination of auxiliary through holes/vias are connected to the embedded capacitor 214 by way of one of the vias 206, 208. In the illustrated example, two auxiliary vias are placed by each of the vias 206, 208. The auxiliary vias 202, 204 are illustrated as having smaller features (e.g., a smaller pad and/or smaller hole diameter) and therefore generally contribute less capacitance when connected. On the contrary, the auxiliary vias 210, 212 may be formed to have larger features (e.g., a larger pad and/or larger hole diameter) and therefore may be expected to contribute more capacitance when connected. Accordingly, the relatively small and relatively large capacitances provided by the various auxiliary vias 202, 204, 210 and 212 may be used in various combinations to provide various combinations of additional capacitance.

To illustrate, FIG. 2B depicts a top view of PCB 200B illustrating an exemplary implementation of the PCB 200A whereby the auxiliary via 204 is electrically connected to the via 208 using, for example, a conductive trace 242 formed on the surface or other layer of the PCB 200A. By connecting the auxiliary via 204 to the embedded capacitor 214 via the via 208, the effective capacitance is approximately the combination of capacitor 220, 224, 226 and 228 shown by the circuit diagram 218B. It will be appreciated that the addition of the capacitance $C_{204}$ in parallel with the capacitance $C_{208}$ will increase the effective capacitance between the via 206 and the via 208. Further, conductive trace 242 may also be used to increase capacitance by varying its physical sizes such as width and length and therefore may enhance flexibility of the capacitance tuning.

FIG. 2C depicts a top view of PCB 200C depicting another combination of auxiliary through holes to increase the effective capacitance between vias 206, 208. In the illustrated example, the via 208 is electrically connected to the auxiliary vias 204 and 212 using conductive traces 242, 244, respectively, and the via 206 is electrically connected to the auxiliary via 210 by conductive trace 246. Circuit diagram 218C illustrates a simplified representation of the resulting circuit whereby the effective capacitance is roughly a result of the illustrated combination of the capacitors 220 and 224–232. As noted above, conductive traces 242, 244, 246, etc., also may be used to increase capacitance by varying its physical sizes such as width and length to enhance the flexibility of the capacitance tuning.

In the event that the connection of one or more auxiliary vias results in an effective capacitance that is greater than ideal or desired, the effective capacitance may be reduced by changing the combination of connected auxiliary vias and/or by using one or more capacitance trimming techniques described in detail below.

Referring now to FIGS. 3A and 3B, an exemplary technique for reducing the effective capacitance of an embedded capacitor is illustrated in accordance with at least one embodiment of the present invention. Discussed above are various techniques for increasing the effective capacitance of an embedded capacitor by increasing the capacitance contributed by vias connected to the embedded capacitor and/or by increasing the number of vias that contribute capacitance. In certain instances, however, the effective capacitance may exceed a desired or ideal capacitance. Accordingly, in at least one embodiment, the capacitance contributed by the vias connected to an embedded capacitor may be reduced by changing the surface plate area and/or the plated hole surface area of one or more of the vias.

FIG. 3A depicts a cross-section view of a circuit module 300A having an IC 302 connected to an IC 204 by a PCB 306A having vias 308A, 310A and an embedded capacitor 320. In the illustrated example, the via 308A is formed as a conical via to provide additional capacitance, as described above with reference to FIG. 1D. However, assume for the following that the resulting effective capacitance exceeds the desired or ideal capacitance.

To reduce the capacitance contributed by the vias 308A, 310B, one or both may be counter drilled to remove both surface plate from the pads 314, 318 as well as conductive plating from the interior surfaces of the vias. To illustrate, FIG. 3B illustrates a modification to PCB 306A (illustrated as PCB 306B) whereby the via 308A is counter drilled to a depth 336 (represented by drilled regions 332) and the via 210A is counter drilled to a depth 338 (represented by drilled region 334), resulting in modified vias 308B, 310B, respectively. The drill diameter preferably is selected to remove some or all of the conductive plating from the interior surface of the vias in the regions 332, 334. Further, the drill shape may be conical or cylindrical.

By removing conductive material from the pads 314, 318 and/or the interior surfaces of the vias 308A, 310A, the capacitance contributed by the resulting vias 308B, 310B typically is reduced as there is less conductive material to interact with the electromagnetic fields produced within the PCB 306B. The depth by which a via may be counter drilled may be determined in a variety of ways. One method may include repeated cycles of counter drilling a short distance and then retesting the effective capacitance until it is within an acceptable range. Alternatively, applicable theoretical or empirical depths may be determined through calculation or experimentation under similar circumstances.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for tuning an effective capacitance of an embedded capacitor in a multilayer circuit board, the embedded capacitor having an embedded capacitor structure in the multilayer circuit board, the embedded capacitor structure being electrically connected to at least one electrically conductive via that electrically interconnects layers of the multilayer circuit board, the embedded capacitor structure having an associated embedded capacitor structure capacitance, the at least one electrically conductive via having a via capacitance, the effective capacitance comprising the embedded capacitor structure capacitance and the via capacitance, the method comprising the step of:

modifying at least one electrically conductive feature of the at least one electrically conductive via to change the via capacitance and the effective capacitance of the embedded capacitor without changing the embedded capacitor structure capacitance of the embedded capacitor.

2. The method as in claim 1, wherein the at least one electrically conductive feature includes an electrically conductive surface area of a surface pad of the at least one electrically conductive via on an outer surface of the multilayer circuit board.

3. The method as in claim 2, wherein the step of modifying the at least one electrically conductive feature includes reducing the electrically conductive surface area of the surface pad to reduce the via capacitance and the effective capacitance of the embedded capacitor without changing the embedded capacitor structure capacitance of the embedded capacitor.

4. The method as in claim 2, wherein the step of modifying the at least one electrically conductive feature includes increasing the electrically conductive surface area of the surface pad to increase the via capacitance and the effective capacitance of the embedded capacitor without changing the embedded capacitor structure capacitance of the embedded capacitor.

5. The method as in claim 4, wherein increasing the electrically conductive surface area of the surface pad includes increasing a diameter of the surface pad.

6. The method as in claim 4, wherein increasing the electrically conductive surface area of the surface pad includes forming an electrically conductive plane on the outer surface of the multilayer circuit board, the electrically conductive plane being proximal to and electrically connected to the surface pad.

7. The method as in claim 1, wherein the at least one electrically conductive feature includes an electrically conductive plating on an interior surface of the at least one electrically conductive via.

8. The method as in claim 7, wherein the step of modifying the at least one electrically conductive feature includes counter drilling the at least one electrically conductive via to remove at least part of the electrically conductive plating from the interior surface of the at least one electrically conductive via to reduce the via capacitance and the effective capacitance of the embedded capacitor without changing the embedded capacitor structure capacitance of the embedded capacitor.

9. The method as in claim 8, wherein the interior surface of the at least one electrically conductive via has a substantially conical shape.

10. The method as in claim 7, wherein the step of modifying the at least one electrically conductive feature includes tap drilling the multilayer circuit board so that the at least one electrically conductive via has a substantially conical shape before the interior surface of the at least one electrically conductive via is plated with electrically conductive material.

11. The method as in claim 1, wherein the at least one electrically conductive feature includes an electrically conductive trace connecting the embedded capacitor to the at least one electrically conductive via.

12. The method as in claim 1, further comprising the step of:
  electrically connecting the at least one electrically conductive via to at least one of one or more auxiliary vias formed in the multilayer circuit board to further change the via capacitance and the effective capacitance of the embedded capacitor without changing the embedded capacitor structure capacitance of the embedded capacitor.

13. The method as in claim 12, wherein the step of electrically connecting the at least one electrically conductive via to at least one of the one or more auxiliary vias includes forming at least one conductive trace between a surface pad of the at least one electrically conductive via and a respective surface pad of each of the at least one of the one or more auxiliary vias.

14. The method as in claim 12, further comprising the step of counter drilling at least one of the one or more auxiliary vias to remove at least part of electrically conductive plating from at least one interior surface of each of the at least one of the one or more auxiliary vias to reduce the via capacitance and the effective capacitance of the embedded capacitor without changing the embedded capacitor structure capacitance of the embedded capacitor.

15. The method as in claim 1, wherein the multilayer circuit board is prefabricated.

* * * * *